(12) United States Patent
Byun et al.

(10) Patent No.: US 12,740,373 B2
(45) Date of Patent: Sep. 15, 2026

(54) METHOD AND APPARATUS FOR ALIGNING WAFER USING LASER SCANNER, SEMICONDUCTOR TRANSFER DEVICE

(71) Applicant: SEMES CO., LTD., Chungcheongnam-do (KR)

(72) Inventors: Hee Jae Byun, Chungcheongnam-do (KR); Kyo Bong Kim, Chungcheongnam-do (KR); Chan Young Choi, Chungcheongnam-do (KR); Wan Hee Jeong, Chungcheongnam-do (KR); Sang Oh Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 403 days.

(21) Appl. No.: 18/134,489

(22) Filed: Apr. 13, 2023

(65) Prior Publication Data

US 2024/0112938 A1 Apr. 4, 2024

(30) Foreign Application Priority Data

Sep. 27, 2022 (KR) ........................ 10-2022-0122056

(51) Int. Cl.
*H10P 72/50* (2026.01)
*B25J 11/00* (2006.01)
(Continued)

(52) U.S. Cl.
CPC ........... *H10P 72/53* (2026.01); *B25J 11/0095* (2013.01); *B25J 13/08* (2013.01); *H10P 72/0606* (2026.01); *H10P 72/7602* (2026.01)

(58) Field of Classification Search
CPC ............. H01L 21/681; H01L 21/67259; H01L 21/68707; H01L 23/544;
(Continued)

(56) References Cited

U.S. PATENT DOCUMENTS 5,443,932 A * 8/1995 Ohta ..................... G03F 9/7023 356/399
2003/0102292 A1* 6/2003 Han ...................... H01L 21/681 438/795

(Continued)

FOREIGN PATENT DOCUMENTS

KR 10-0365960 3/2003
KR 10-2010-0026743 3/2010

(Continued)

OTHER PUBLICATIONS

"How to find the Center point of any given Arc", published on Youtube on Aug. 2, 2021, https://www.youtube.com/watch?v=cnx0HfTSzvc (Year: 2021).*

(Continued)

*Primary Examiner* — Wade Miles
*Assistant Examiner* — Jaewook Jung
(74) *Attorney, Agent, or Firm* — WOMBLE BOND DICKINSON (US) LLP

(57) ABSTRACT

A method and apparatus for aligning a wafer using a laser scanner, and a semiconductor transfer device are provided. The method includes a laser irradiation operation of irradiating a laser toward the wafer using a laser scanner disposed on a rear side or a lower side of the wafer and obtaining an image, a dataset acquisition operation of obtaining location information of at least three wafer edges by using a distance corresponding to a laser irradiation direction to a wafer edge in the image, a calculation operation of calculating a center point of the wafer by using the obtained location information of the wafer edge, and a detection operation of detecting whether a calculated center point is within a preset tolerance range.

16 Claims, 8 Drawing Sheets

(51) Int. Cl.
*B25J 13/08* (2006.01)
*H10P 72/00* (2026.01)
*H10P 72/76* (2026.01)

(58) Field of Classification Search
CPC .. H01L 2223/54426; H01L 2223/54493; B25J 11/0095; B25J 13/08
See application file for complete search history.

(56) References Cited

U.S. PATENT DOCUMENTS

| | | | | |
|---|---|---|---|---|
| 2011/0050882 | A1* | 3/2011 | Lee | G06V 10/242<br>348/95 |
| 2015/0138566 | A1 | 5/2015 | Wagenleitner | |
| 2017/0092520 | A1 | 3/2017 | Kim et al. | |
| 2017/0125271 | A1* | 5/2017 | Minato | H10P 72/0606 |

FOREIGN PATENT DOCUMENTS

| | | | |
|---|---|---|---|
| KR | 10-2013-0089176 | 8/2013 | |
| KR | 10-2017-0037031 | 4/2017 | |
| KR | 10-2017-0085569 | 7/2017 | |
| KR | 10-2074534 | 3/2020 | |
| KR | 102126390 B1 * | 6/2020 | H01L 21/6831 |
| WO | 2016/081459 | 5/2016 | |

OTHER PUBLICATIONS

"English Translation of KR102126390B1", Translated on Jul. 18, 2021 (Year: 2021).*

* cited by examiner

METHOD AND APPARATUS FOR ALIGNING WAFER USING LASER SCANNER, SEMICONDUCTOR TRANSFER DEVICE

CROSS-REFERENCE TO RELATED APPLICATION(S)

This application claims benefit of priority to Korean Patent Application No. 10-2022-0122056 filed on Sep. 27, 2022 in the Korean Intellectual Property Office, the disclosure of which is incorporated herein by reference in its entirety.

BACKGROUND

1. Field

The present disclosure relates to a method and apparatus for aligning a wafer using a laser scanner, and a semiconductor transfer device, and more particularly, to a method and apparatus for detecting center alignment of a plurality of wafers at once by detecting edges of a plurality of wafers using a single laser scanner, and a semiconductor transfer device including the same.

2. Description of Related Art

Semiconductor devices such as integrated circuit elements may generally be formed by repeatedly performing a series of processing operations on a substrate such as a silicon wafer. The semiconductor devices may be formed on the wafer by repeatedly performing processes such as, for example, a deposition process of forming a film on a wafer, a photo process of drawing a pattern on a wafer, an etching process for forming the film into patterns having electrical properties, an ion implantation process or diffusion process for implanting or diffusing impurities into the patterns, and cleaning and rinsing process for removing impurities from the wafer on which the patterns are formed.

Prior to performing the above-described process, in particular, prior to performing the photo process, the center alignment of the wafer is required. Wafer center alignment may be performed by obtaining a wafer image using a camera and rotating a wafer chuck or stage so that the wafer is positioned in a preset direction using the wafer image. In detail, in order to proceed with the photo process, the center of the wafer should be accurately aligned so that patterns suitable for each area may be photosensitive. Beyond simply aligning the wafer within a certain range, it is necessary to accurately align the center of the wafer in place.

In detail, in the patent literature of the related art, the light receiving unit and the light emitting unit are positioned facing each other vertically with respect to the transfer arm, and the wafer center is aligned by detecting the position of the wafer located therebetween.

However, since a light receiving unit and a light emitting unit should be installed for each wafer to align the wafers as described above, there is a problem in that the number of sensors is required as much as the number of wafers. To determine the presence or absence of wafers or wafer alignment for a plurality of wafers stacked in the vertical direction, there are disadvantages due to limitations such as interface management and component arrangement/electrical design.

In addition, since the photo robot that moves the wafer between the light receiving unit and the light emitting unit uses two hands, one hand should be left out whenever each hand is photographed to perform alignment, and therefore, two-hand positioning at the same time may be performed is not possible. Even if it is aligned, since errors may occur in the process of moving both hands to the correct position, there is a problem that is more difficult to accurately match the center.

Therefore, in the case of the commonly used die-to-die comparison method, since respective dies on the wafer should all be compared, the time required for the wafer inspection process may be further increased.

SUMMARY

An aspect of the present disclosure is to provide a method and apparatus for aligning a wafer using a laser scanner capable of determining whether wafer centers are aligned, simultaneously for a plurality of stacked wafers, using one laser scanner, and a semiconductor transfer device.

According to an aspect of the present disclosure, a method of aligning a wafer using a laser scanner includes a laser irradiation operation of irradiating a laser toward the wafer using a laser scanner disposed on a rear side or a lower side of the wafer and obtaining an image; a dataset acquisition operation of obtaining location information of at least three wafer edges by using a distance corresponding to a laser irradiation direction to a wafer edge in the image; a calculation operation of calculating a center point of the wafer by using the obtained location information of the wafer edge; and a detection operation of detecting whether a calculated center point is within a preset tolerance range.

According to an aspect of the present disclosure, an apparatus for aligning a wafer, using a laser scanner, includes a laser scanner disposed on a rear side or a lower side of the wafer and irradiating a laser toward the wafer; and a detection unit obtaining location information of at least three wafer edges by using a distance corresponding to a laser irradiation direction to a wafer edge in an image obtained by the laser scanner. The detection unit calculates a center point of the wafer using the obtained location information of the at least three wafer edges, and detects whether the calculated center point is within a preset tolerance range to determine a wafer alignment state.

According to an aspect of the present disclosure, a semiconductor transfer device includes a wafer seating portion configured to support a wafer; a robot arm seating the wafer on the wafer seating portion; one laser scanner disposed on the robot arm located on a rear side or a lower side of the wafer and irradiating a laser to an edge of the wafer seated on the wafer seating portion; and an interface unit including a detection unit detecting a wafer edge in an image acquired by the laser scanner and a communication unit communicating with the robot arm and the laser scanner. The detection unit extracts location information of two wafer edges in which a location information deviation of the wafer edges is within a preset deviation threshold range from among obtained location information of at least three wafer edges, calculates a center point of the wafer using extracted location information of the two wafer edges and mechanical information of the wafer or the wafer seating portion, and detects whether the calculated center point is within a preset tolerance range to determine a wafer alignment state.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
FIG. 1 illustrates a perspective view of a semiconductor transfer device according to an embodiment.
Figure 1:
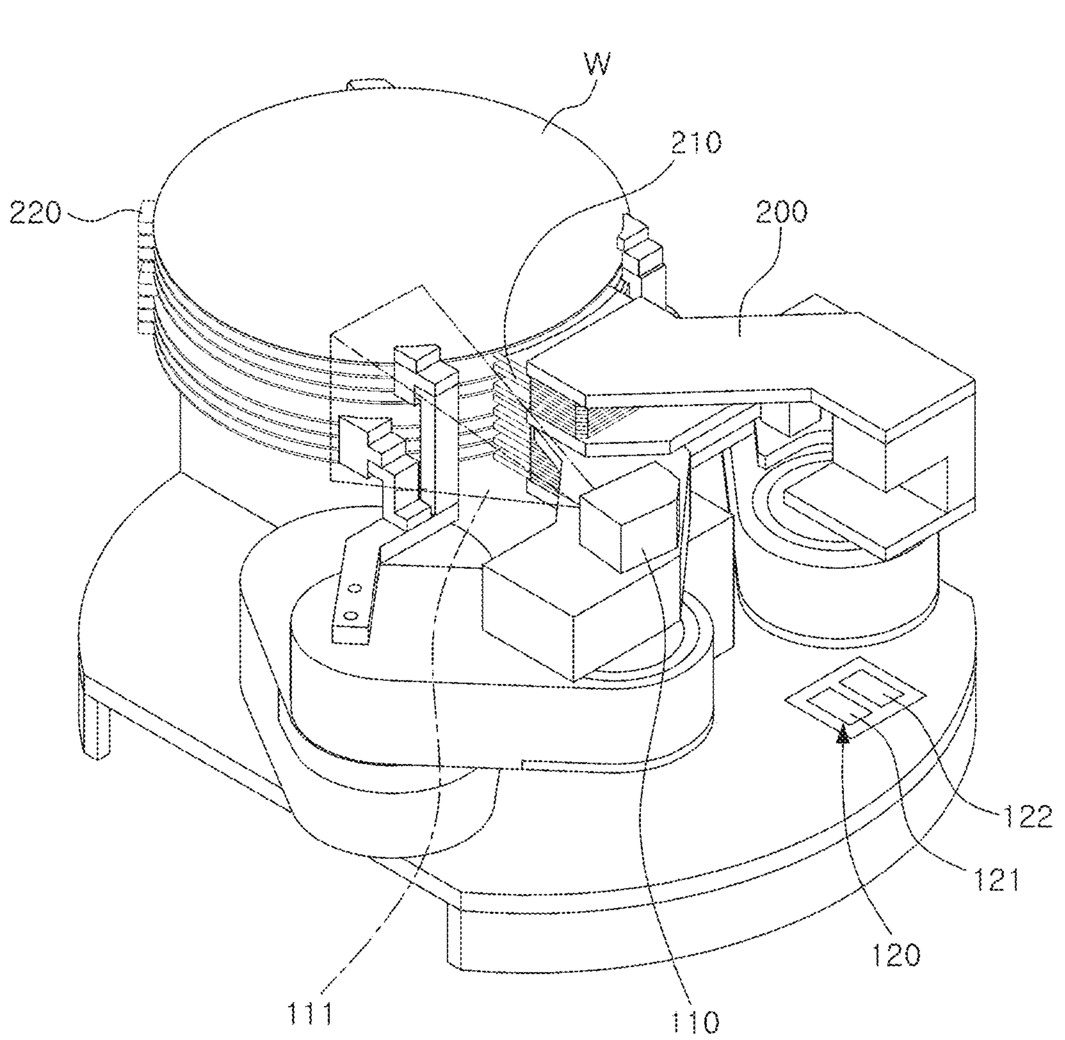

Hereinafter, embodiments will be described in detail so that those skilled in the art may easily practice the present disclosure with reference to the accompanying drawings. However, in describing an embodiment in detail, if it is determined that a detailed description of a related known function or configuration may unnecessarily obscure the gist of the present disclosure, the detailed description will be omitted. In addition, the same reference numerals are used throughout the drawings for parts having similar functions and actions. In addition, in the present specification, terms such as 'on', 'upper portion', 'upper surface', 'below', 'lower portion', 'lower surface', 'side' and the like are based on the drawings, and may be changed depending on the direction in which components are actually disposed.

In addition, throughout the specification, when a part is said to be 'connected' to another part, it is not only 'directly connected', but also 'indirectly connected' with other components therebetween. Further, 'including' a certain component means that other components may be further included, rather than excluding other components unless otherwise stated.

Figure 2:
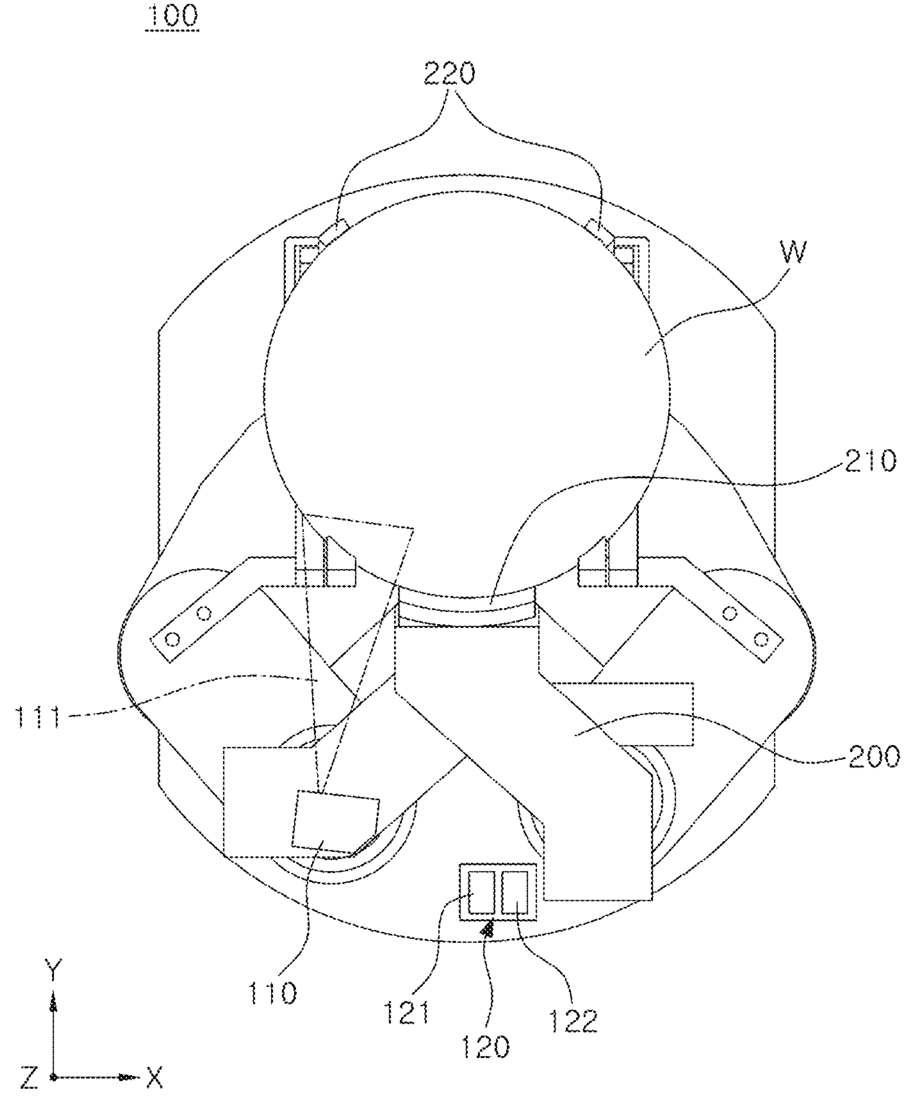
FIG. 2 is a plan view of a semiconductor transfer device according to an embodiment.

FIGS. 1 and 2 illustrate a perspective view and a plan view of a semiconductor transfer device 100 according to an embodiment.

Referring to FIGS. 1 and 2, the semiconductor transfer device 100 according to an embodiment may include a wafer seating portion 210 configured to support the wafer W, a robot arm 200 for seating the wafer W on the wafer seating portion 210, one laser scanner 110 disposed on the robot arm 200 located on the rear side or lower side of the wafer W and radiating a laser to the edge of the wafer W seated on the wafer seating portion 210, and an interface unit 120 including a detection unit 121 for receiving an image acquired by the laser scanner 110 and detecting a wafer edge in the image and a communication unit 122 communicating with the robot arm 200 and the laser scanner 110.

In the semiconductor transfer device 100, when the robot arm 200 places the wafer W on the wafer seating portion 210, the wafer W may be fixed by the plurality of wafer fixing parts 220.

In this case, after determining whether or not the wafer W is seated on the wafer seating portion 210 and whether or not the wafer W is properly aligned, the wafer W is fixed with the wafer fixing part 220.

The laser scanner 110 according to an embodiment is disposed on the rear side or lower side of the seated wafer (W) and may irradiate a laser to a portion of the edge of the wafer (W), and the image obtained by the laser scanner 110 may be transmitted to the detection unit 121.

The laser scanner 110 may be one laser scanner 110, and the detection unit 121 may be an interface board connected to the laser scanner 110 by forming one channel and capable of transmitting data to an external device.

In detail, one laser scanner 110 and one interface board are connected one-to-one to transmit/receive wafer state data including existence and alignment of a plurality of wafers W.

The laser scanner 110 according to an embodiment may include an image sensor and a CMOS capable of 3D scanning, or include a laser sensor capable of 1D or 2D scanning and drive motor capable of rotating in 2D or 1D. For example, as illustrated in FIG. 2, edge detection for a plurality of wafers W may be performed at once by line-scanning the wafers W in the X, Y, and Z axes.

Figure 3:
FIG. 3 schematically illustrates a process of scanning a wafer by an apparatus for aligning a wafer using a laser scanner according to an embodiment.
Figure 3:
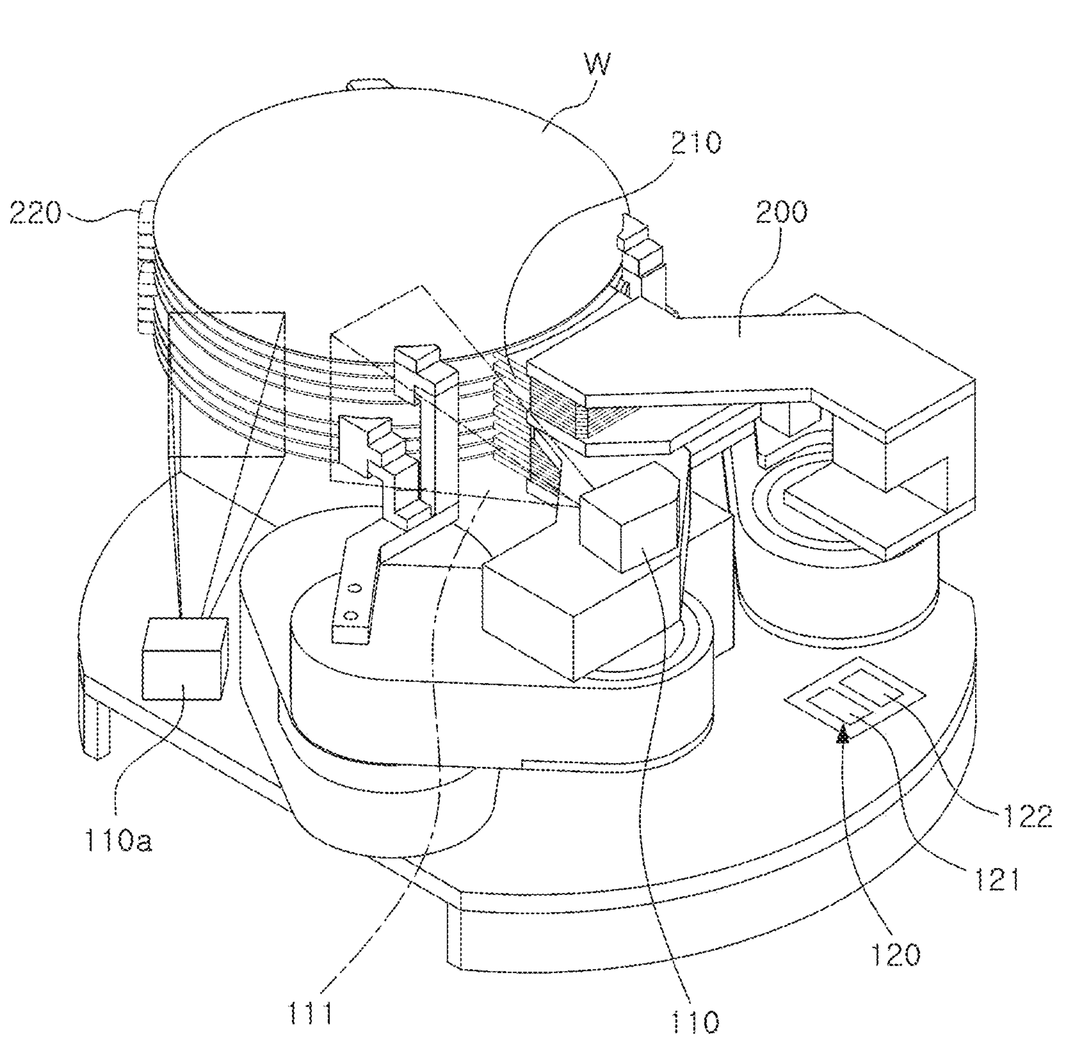
Figure 4:
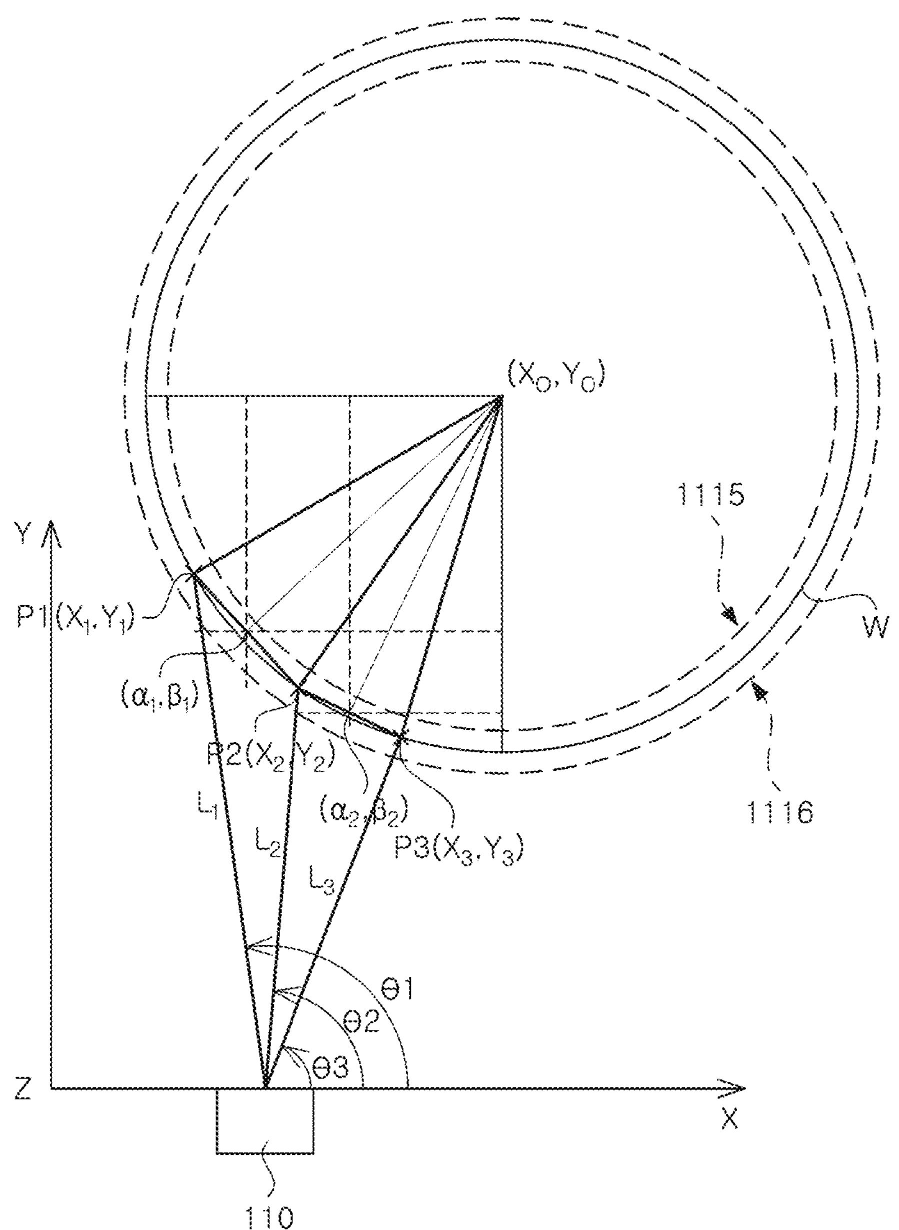
FIG. 4 illustrates a process in which an apparatus for aligning a wafer using a laser scanner according to an embodiment detects a wafer edge and calculates a center point of a wafer.
Figure 5:
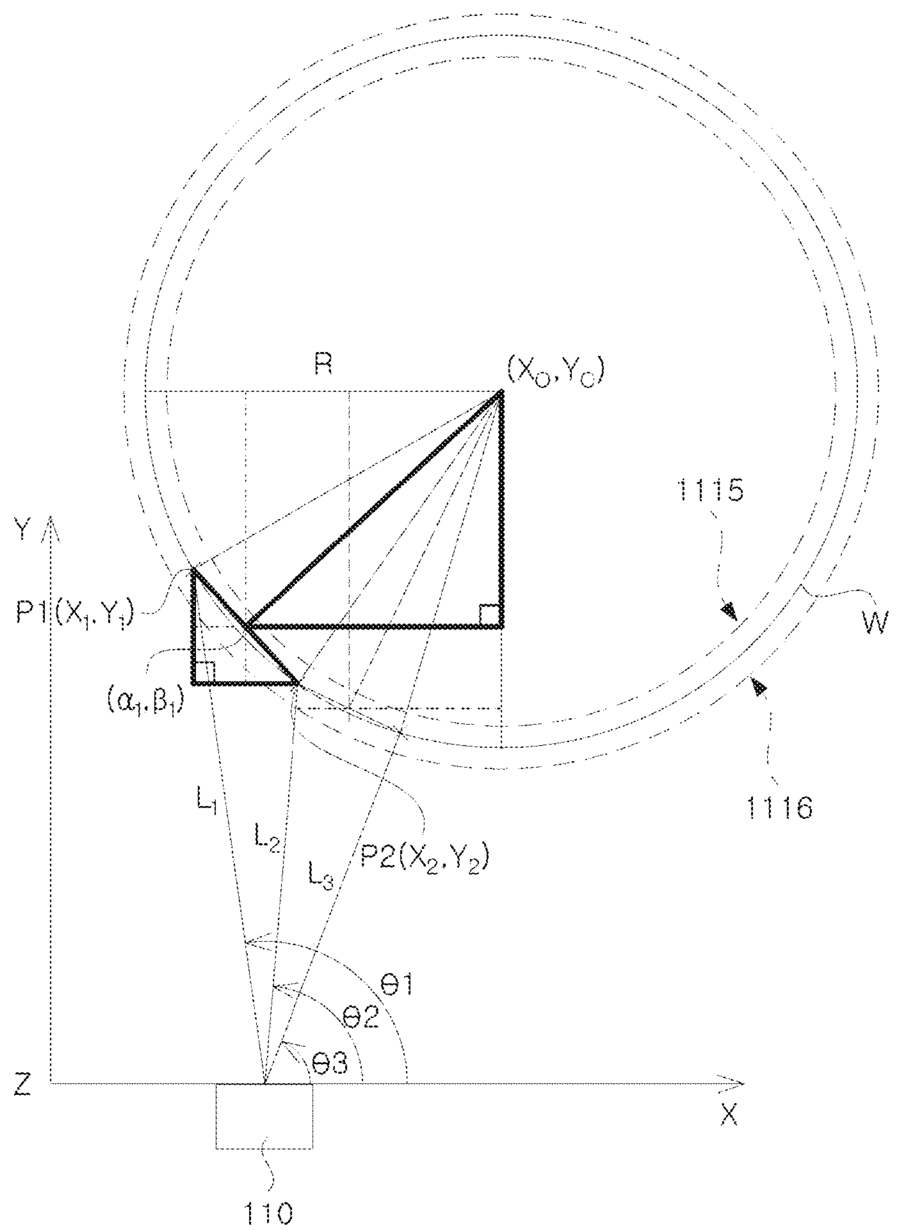
FIG. 5 illustrates a process in which an apparatus for aligning a wafer using a laser scanner according to an embodiment detects a wafer edge and calculates a center point of a wafer.
Figure 6:
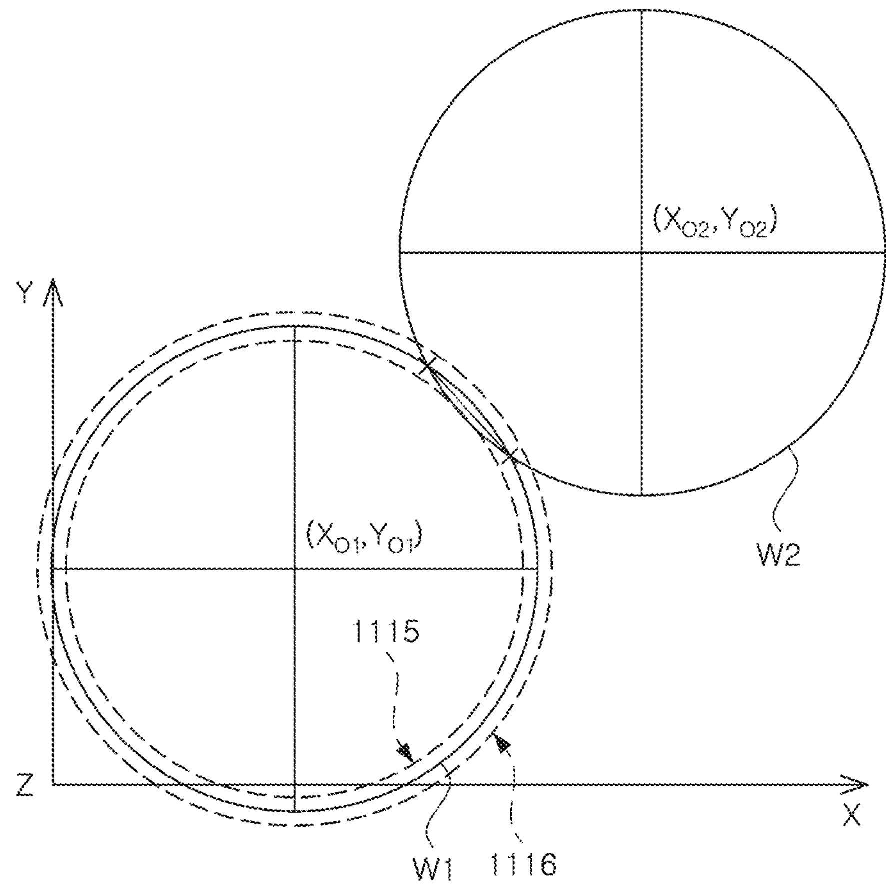
FIG. 6 illustrates a process in which an apparatus for aligning a wafer using a laser scanner according to an embodiment detects a wafer edge and calculates a center point of a wafer.

FIG. 3 schematically illustrates a process of scanning a wafer W by an apparatus for aligning a wafer using a laser scanner 110 according to an embodiment, and FIGS. 4 to 6 illustrate a process in which the apparatus for aligning a wafer using the laser scanner 110 according to an embodiment detects a wafer edge and determines whether the wafer is aligned in the correct position.

As illustrated in FIG. 3, the laser scanners 110 and 110*a* according to an embodiment may be disposed on the lower side of the rear side or the lower side of the wafer W. The laser scanners 110 and 110*a* are disposed at the rear or side except for the front where the wafer W enters or leaves, and may determine whether the wafer W is present or aligned without interfering with the movement of the wafer W.

In addition, the laser scanners 110 and 110*a* according to an embodiment may be disposed at different heights from the wafers W to have a constant field of view (FoV) with respect to the plurality of wafers W.

As illustrated in FIG. 3, the heights of the laser scanners 110 and 110*a* and the wafer seating portion 210 may be disposed differently, such that the laser scanners 110 and 110*a* and the edge of each wafer W or the seating portion 210 on which each wafer W is seated maintain a constant angle. In detail, the laser scanner 110 may be disposed lower than the wafer seating portion 210.

Therefore, the laser scanner 110 may be disposed at the rear lower portion of the wafer W, or the laser scanner 110*a* may be disposed at the lateral lower portion of the wafer W, and thus, wafers (W) stacked in multiple layers may be distinguished and recognized within the field of view (Fov).

Also, as an example, a wafer measurement distance according to a focal range of the laser scanner 110 may be disposed to pass the front edge of the wafer. The laser scanner 110 scans a portion of the edge of the wafer W, and to accurately scan the edge of the wafer W, the focal range of the laser scanner 110 may be longer than the distance between the laser scanner 110 and the wafer seating portion 210.

According to an embodiment, the detection unit 121 may determine whether each wafer center is aligned based on wafer edges obtained from a plurality of wafer areas in an image by the laser scanners 110 and 110*a*. Hereinafter, assuming that an image taken by the laser scanner 110 illustrated in FIG. 3 is used, a process of calculating a center point that is a wafer center, for example, center coordinates ($X_0$, $Y_0$) based on the obtained wafer edge will be described. It is sufficient that the laser scanner is located on the rear side or lower side and has a certain field of view with respect to the wafer (W), and therefore, the present disclosure is not limited to the laser scanner 110 illustrated in FIG. 3.

The detection unit 121 according to an embodiment may detect a distance from the laser scanner 110 to a portion of a wafer edge through a data set obtained from the laser scanner 110. Whether the wafer seating portion 210 is empty may be determined by comparing the detected distance with a reference distance set based on mechanical information stored in the database. By transmitting the confirmation result received by the interface unit 120 to the robot arm 200, the detection unit may command the robot arm 200 whether or not to pick the wafer W.

For example, the detection unit 121 according to an embodiment may determine the presence or absence of a wafer according to the first location information of the wafer edge scanned by the laser scanner 110.

When the wafer W is seated on the wafer seating portion 210, the area is divided in the vertical direction based on the dead zone formed while the wafer edge crosses the laser of the laser scanner 110, and when the detection unit 121 detects that the distance scanned by the laser scanner 110 is the peak distance within the divided area, it is determined that a wafer is present. Therefore, the laser scanner 110 irradiates the laser at a constant angle θ, and the detection unit 121 may determine whether there are a plurality of wafers W by using at least one piece of wafer edge information for each vertical height (in the Z direction, illustrated in FIG. 2).

In this case, the laser scanner 110 acquires one position with respect to the edge of the wafer W, and the one position means values where (X, Y) are the same. For example, the presence or absence of a wafer may be determined by extracting first location information having a value of (X, Y) and comparing a measurement distance obtained from the first location information with a reference distance. The peak distance may be compared with a reference distance measured by the laser scanner 110 when a wafer is present.

Alternatively, when the wafer W is present in the wafer seating portion 210, the detection unit 121 according to an embodiment may extract at least two of first location information P1, second location information P2, and third location information P3 which are randomly extracted from a data set obtained by measuring the distance from the laser scanner 110 to the wafer edge, and may calculate the coordinates of the center of the wafer W, using at least two of the first location information P1, the second location information P2, and the third location information P3.

In detail, as illustrated in FIG. 4, the laser scanner 110 scans a laser beam on a portion of the wafer W to form a sensing area 111 (illustrated in FIG. 3) on the portion of the wafer W. The laser scanner 110 may irradiate laser at a plurality of angles θ, and obtain a distance from the laser scanner 110 to the edge of the wafer W at a specific angle.

For example, the detection unit 121 may know from the laser scanner 110 that the distance L1 is measured at the angle θ1, the distance L2 is measured at the angle θ2, and the distance L3 is measured at the angle θ3. Alternatively, as mechanical information on the semiconductor transfer device 100 is already known, angle information (θ1, θ2, θ3) may be obtained from mechanical information, and only distance values L1, L2 and L3 measured at respective angles may be acquired from the laser scanner 110.

First location information P1 (X1, Y1), second location information P2 (X2, Y2), and third location information P3 (X3, Y3) may be obtained using the values. For example, the coordinates of P1 (L1 cos θ1, L1 sin θ1), P2 (L2 cos θ2, L2 sin θ2), and P3 (L3 cos θ3, L3 sin θ3) with respect to the laser scanner 110 may be obtained.

In detail, coordinate values of at least three positions of the edge of the wafer W may be obtained using angle and distance values obtained from the laser scanner 110 or the semiconductor transfer device 100. The at least three positions refer to positions having the same Z-axis coordinates and different (X, Y) positions.

The detection unit 121 according to an embodiment may extract center coordinates ($X_0$, $Y_0$), which are the center of the wafer, using two pieces of extracted location information among the at least three locations, for example, the first location information P1, the second location information P2, and the third location information P3, and pre-stored mechanical information, and may detect whether the wafer center is aligned in the correct position by determining whether the calculated center coordinates ($X_0$, $Y_0$) are within a preset tolerance range.

As an embodiment, the detection unit 121 calculates the length of the chord connected in a straight line and the position of the center point ($\alpha_n$, $\beta_n$) of the chord by Equation 1 below, by connecting two pieces of location information extracted from a data set scanned by the laser scanner 110 by a straight line.

$$\alpha_n = (X_n + X_{n+1})/2$$
$$\beta_n = (Y_n + X_{n+1})/2 \quad \text{[Equation 1]}$$

As illustrated in FIG. 4, when P1 and P2 are extracted from the data set scanned by the laser scanner 110 and the two pieces of extracted location information are connected by a straight line, the length of the chord connected in a straight line and the coordinates of the center point ($\alpha_1$, $\beta_1$) of the chord may be calculated.

Alternatively, when P2 and P3 are extracted from the data set scanned by the laser scanner 110 and the two pieces of extracted location information is connected by a straight line, the length of the chord connected in a straight line and the coordinates of the central point ($\alpha_2$, $\beta_2$) of the chord may be calculated.

The detection unit 121 according to an embodiment may calculate half the length of the chord connected in a straight line by Equation 2 below, when two pieces of location information extracted from the data set scanned by the laser scanner 110 are connected by a straight line.

$$LC_n = \left(\sqrt{(X_{n+1} - X_n)^2 + (Y_{n+1} - Y_n)^2}\right)/2 \quad \text{[Equation 2]}$$

As illustrated in FIG. 4, when P1 and P2 are extracted from the data set scanned by the laser scanner 110 and the two pieces of extracted location information are connected by a straight line, the half length ($LC_1$) of the length of a chord connected in a straight line is $\sqrt{(X_2-X_1)^2+(Y_2-Y_1)^2)}/2$.

Alternatively, when P2 and P3 are extracted from the data set scanned by the laser scanner 110 and the two pieces of extracted location information are connected by a straight line, the length ($LC_2$) of a chord connected in a straight line is $\sqrt{(X_3-X_2)^2+(Y_3-Y_2)^2}/2$.

The detection unit 121 according to an embodiment may calculate the foot of perpendicular ($FOP_n$) from the center coordinates ($X_0$, $Y_0$) of the wafer with ($X_n$, $Y_n$) and ($X_{n+1}$, $Y_{n+1}$) as edges and the radius R to the center point ($\alpha_n$, $\beta_n$) of the chord by Equation 3 below.

$$FOPn = \sqrt{R^2 - LCn^2} \quad \text{[Equation 3]}$$

As illustrated in FIG. 5, the detection unit 121 according to an embodiment may calculate the coordinates of the center of the wafer ($X_0$, $Y_0$) by Equation 4 below, using a similar shape between a right triangle with the connecting line between ($X_n$, $Y_n$) and ($X_n+_1$, $Y_n+_1$) as the hypotenuse and a right triangle with the connecting line between the wafer center coordinates ($X_0$, $Y_0$) and the center point ($\alpha_n$, $\beta_n$) of the chord as the hypotenuse.

[Equation 4]

$$X_0 = \frac{X_{n+1} + X_n}{2} \pm \frac{(Y_{n+1} - Y_n)\sqrt{R^2 - \frac{1}{4}\{(X_{n+1} - X_n)^2 + (Y_{n+1} - Y_n)^2\}}}{\sqrt{(X_{n+1} - X_n)^2 + (Y_{n+1} - Y_n)^2}}$$

$$Y_0 = \frac{Y_{n+1} + Y_n}{2} \mp \frac{(X_{n+1} - X_n)\sqrt{R^2 - \frac{1}{4}\{(X_{n+1} - X_n)^2 + (Y_{n+1} - Y_n)^2\}}}{\sqrt{(X_{n+1} - X_n)^2 + (Y_{n+1} - Y_n)^2}}$$

Therefore, the detection unit 121 according to an embodiment may obtain at least two wafer edge coordinates from the data set obtained from the laser scanner 110, and as illustrated in FIG. 5, calculate the length of each side of a right triangle with the connecting line between ($X_n$, $Y_n$) and ($X_{n+1}$, $Y_{n+1}$) as the hypotenuse and the connecting line between the wafer center coordinates ($X_0$, $Y_0$) and the chord center point ($\alpha_n$, $\beta_n$) as the hypotenuse, and calculate expected position coordinates of center coordinates ($X_0$, $Y_0$).

In this case, the center coordinates ($X_0$, $Y_0$) by the + and − signs may appear in two cases as follows.

Case 1)

$$X_{01} = \frac{X_{n+2} + X_n}{2} + \frac{(Y_{n+1} - Y_n)\sqrt{R^2 - \frac{1}{4}\{(X_{n+1} - X_n)^2 + (Y_{n+1} - Y_n)^2\}}}{\sqrt{(X_{n+1} - X_n)^2 + (Y_{n+1} - Y_n)^2}}$$

$$Y_{01} = \frac{Y_{n+1} + X_n}{2} - \frac{(X_{n+1} - X_n)\sqrt{R^2 - \frac{1}{4}\{(X_{n+1} - X_n)^2 + (Y_{n+1} - Y_n)^2\}}}{\sqrt{(X_{n+1} - X_n)^2 + (Y_{n+1} - Y_n)^2}}$$

Case 2)

$$X_{02} = \frac{Y_{n+1} + X_n}{2} - \frac{(Y_{n+1} - Y_n)\sqrt{R^2 - \frac{1}{4}\{(X_{n+1} - X_n)^2 + (Y_{n+1} - Y_n)^2\}}}{\sqrt{(X_{n+1} - X_n)^2 + (Y_{n+1} - Y_n)^2}}$$

-continued $$Y_{02} = \frac{Y_{n+1} + X_n}{2} + \frac{(X_{n+1} - X_n)\sqrt{R^2 - \frac{1}{4}\{(X_{n+1} - X_n)^2 + (Y_{n+1} - Y_n)^2\}}}{\sqrt{(X_{n+1} - X_n)^2 + (Y_{n+1} - Y_n)^2}}$$

The central coordinates ($X_0$, $Y_0$) of the wafer calculated by the detection unit 121 according to an embodiment may be classified as case 1 and case 2, and the detection unit 121 may determine the final wafer center coordinates ($X_0$, $Y_0$) based on mechanical information such as the installation position of the laser scanner 110.

As an example, as illustrated in FIG. 6, by comparing whether the calculated wafer center coordinates ($X_0$, $Y_0$) are within the inner limit 1115 or outer limit 1116 range, the center coordinates ($X_0$, $Y_0$) within the range may be determined as the calculated center coordinates.

For example, the size of the wafer W is approximately 300 mm in diameter, and the wafer guide is approximately 303 mm in diameter, and therefore, the inner limit 1115 or outer limit 1116 may be set within the range of ±3 mm, and the range of the inner limit 1115 or the outer limit 1116 may be set using mechanical information.

Therefore, to determine whether the wafer (W) is located and aligned between the inner limit 1115 and the outer limit 1116 preset according to the instrument seating limit, the center coordinates ($X_{01}$, $Y_{01}$) located within the inner limit 1115 or the outer limit 1116 may be determined as the calculated center coordinates ($X_0$, $Y_0$).

Alternatively, by comparing whether the center coordinates ($X_{01}$, $Y_{01}$) or ($X_{02}$, $Y_{02}$) are within an allowable range of the preset center coordinates, the center coordinates ($X_{01}$, $Y_{01}$) within the range may be determined as the calculated center coordinates.

When the calculated center coordinates ($X_{01}$, $Y_{01}$) are present within the range of the correct position, it is determined that the wafer W is aligned to the center, and the semiconductor manufacturing apparatus may perform a photo process on the wafer.

Alternatively, based on the mechanical information of the semiconductor transfer device stored in the database, the center coordinates ($X_{01}$, $Y_{01}$) of the point where the wafer W is expected to be located may be determined as the calculated center coordinates ($X_0$, $Y_0$).

Therefore, as illustrated in FIG. 6, by determining the center coordinates ($X_{01}$, $Y_{01}$) as the calculated center coordinates ($X_0$, $Y_0$), and determining whether the center coordinates ($X_0$, $Y_0$) are within a preset tolerance range, whether the wafer W is properly aligned may be determined.

On the other hand, as another embodiment, the detection unit 121 extracts at least three pieces of location information from a data set of the wafer edge positions scanned by the laser scanner 110, and when the deviation of the three pieces of extracted location information exceeds a preset deviation threshold range, the corresponding location information may be deleted and then other location information may be extracted.

A notch is formed on the wafer (W) to determine the front direction, and the notch has a different curvature from the edge of the other wafer (W). Therefore, when one of the first location information (P1) or the second location information (P2) extracted from the wafer edge location data set is a notch, even when the wafer W is aligned, the center coordinates calculated from the first location information P1 or the second location information P2 may deviate from the preset tolerance range of the center of the wafer W.

Therefore, when a deviation of the location information P1, P2, and P3 extracted from the wafer edge data set scanned by the laser scanner 110 exceeds a preset deviation threshold range, the detection unit 121 according to an embodiment may delete the extracted location information and determine whether the wafer W is aligned using other location information.

Alternatively, the detection unit 121 according to an embodiment may calculate at least three center coordinates using two pieces of location information among at least three pieces of location information P1, P2 and P3 extracted from the wafer edge data set scanned by the laser scanner 110, and when any of the deviations of the center coordinates exceeds the preset deviation threshold range, the detection unit 121 may delete the location information used to calculate the center coordinates, and may determine whether the wafer (W) is aligned using the remaining location information.

Accordingly, the detection unit 121 according to an embodiment may determine whether the wafer (W) is aligned by calculating the coordinates ($X_0$, $Y_0$) of the center of the wafer (W), according to the location information of at least two of the first location information P1, the second location information P2, and the third location information P3 of the edge of the wafer W scanned by the laser scanner 110. In detail, the detection unit 121 may measure the distance (L) from the laser scanner 110 to the edge of the wafer (W) in the image and compare deviation of center coordinates calculated from randomly extracted first location information (P1), second location information (P2) and third location information (P3), or the location information, with the preset deviation threshold range, thereby filtering a data set including a wafer notch in the extracted location information.

In addition, for example, when the wafer notch is not included and the location information standard deviation of the wafer edge thus is within a preset deviation threshold range, alignment of the wafer may be detected by comparing the center coordinate calculated using the extracted location information of the wafer edge with a preset wafer center tolerance range. The tolerance range of the wafer center may be set in advance in consideration of the mechanical characteristics of the wafer W and the wafer seating portion 210.

When the center coordinates ($X_0$, $Y_0$) exceed the tolerance range of the wafer center, the interface unit 120 according to an embodiment may modify the seating coordinates of the wafer (W) by reflecting the error between the calculated center coordinates ($X_0$, $Y_0$) and the preset tolerance range of the wafer center and may drive the robot arm 200 with the modified wafer (W) seating coordinates.

On the other hand, the detection unit 121 according to an embodiment generates a wafer state according to whether the wafer (W) is present or whether the wafer (W) is aligned as a flag bit, and the data set created with the flag bit may be transmitted to the main controller.

A bit may be generated as 1 when the wafer W is present and generated as 0 if it is not present, and flag bits for whether the wafer W is present may be generated for each angle θ. In addition, by additionally specifying a bit about whether the wafer (W) is aligned, when the wafer is present and alignment is completed, a flag bit may be generated as (1, 1), and when the wafer is present but is not aligned, a flag bit may be generated as (1, 0), and when the wafer is not present, a flag bit may be generated as (0,0).

Figure 7:
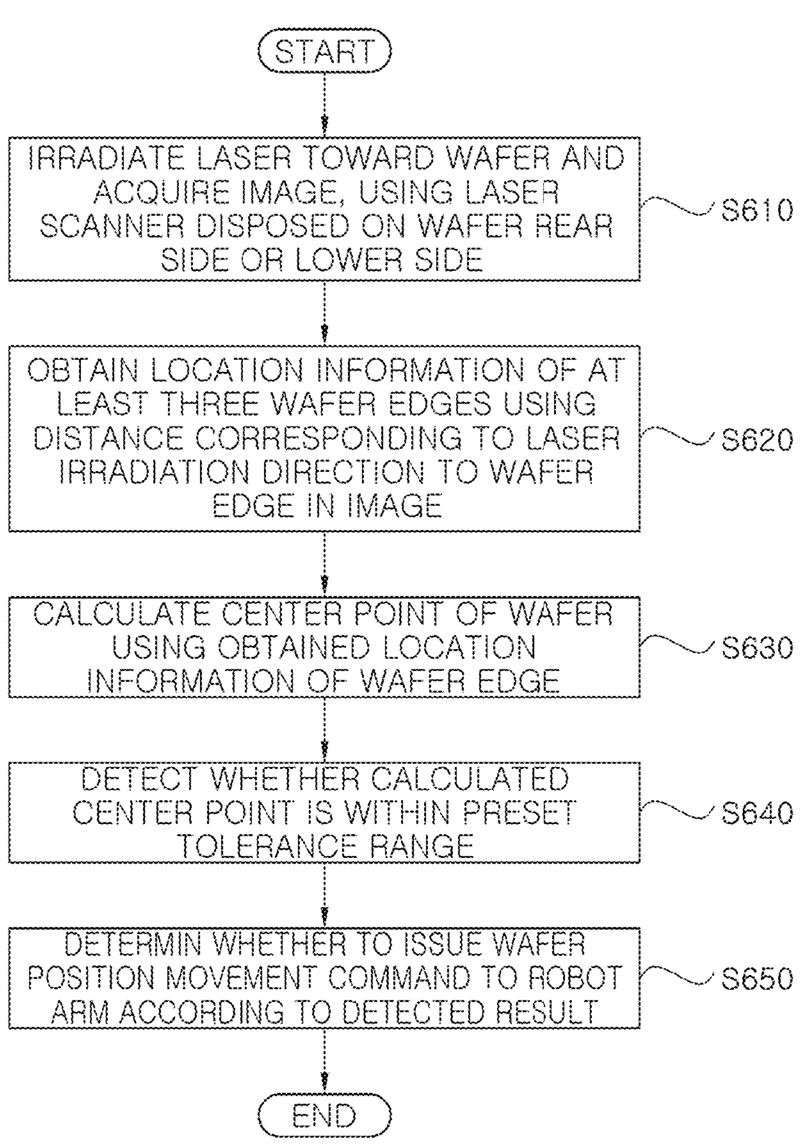
FIG. 7 is a flow chart of a method of aligning a wafer using a laser scanner according to an embodiment.
Figure 8:
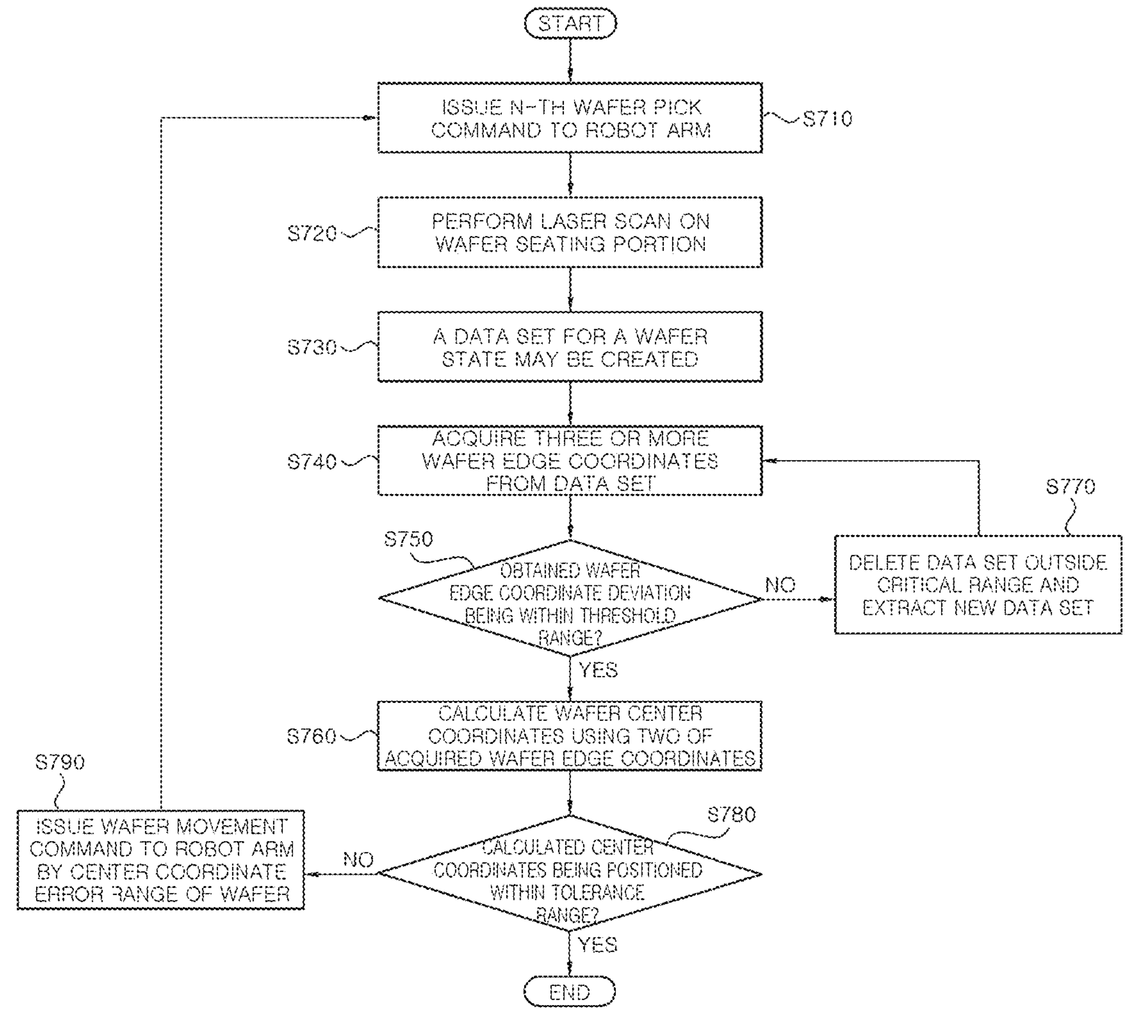
FIG. 8 illustrates a detailed process of a method of aligning a wafer using a laser scanner according to an embodiment.

FIGS. 7 to 8 are flowcharts and illustrate detailed processes of a method of aligning a wafer using the laser scanner 110 according to an embodiment.

As illustrated in FIG. 7, a method of aligning a wafer using the laser scanner 110 according to an embodiment may include irradiating a laser toward the wafer (W) and acquiring an image, using the laser scanner 110 disposed on the rear side or lower side of the wafer (W) (S610), obtaining location information of at least three wafer edges using a distance corresponding to a laser irradiation direction to the wafer edge in the image (S620), calculating the center point of the wafer (W) using the obtained location information of the wafer edge (S630), detecting whether the calculated center point is within a preset tolerance range (S640), and determining whether to issue a wafer position movement command to the robot arm 200 according to the detected result (S650).

In this case, the center point of the wafer (W) includes the center coordinates ($X_0$, $Y_0$) of the wafer (W), and it is detected whether the calculated center coordinates ($X_0$, $Y_0$) are within a preset tolerance range.

In addition, according to an embodiment, operation S620 may include randomly extracting first location information (P1), second location information (P2), and third location information (P3) for wafer edges in the image; and detecting whether deviations of the extracted first location information, second location information, and third location information are within a preset deviation threshold range.

By detecting the distance to the edge of the wafer (W) corresponding to the laser irradiation direction for the randomly extracted first location information (P1), second location information (P2), and third location information (P3), the location coordinates of P1, P2, and P3 may be acquired, and whether the deviations of P1, P2, and P3 are within a preset deviation threshold range may be detected.

In operation S630, when it is detected that the deviation of the first location information P1, the second location information P2, and the third location information P3 is within a preset deviation threshold range, the center point of the wafer may be calculated using at least two pieces of location information among P1, P2, and P3, and when it is detected that the deviations of P1, P2, and P3 are out of a preset deviation threshold range, the P1, P2, and P3 may be deleted and new wafer edge location information may be acquired.

Alternatively, when it is detected that the deviation of at least two of the extracted location information is within a preset deviation threshold range, center coordinates may be calculated using the at least two pieces of extracted location information.

On the other hand, in operation S630, the center point of the wafer (W) may be calculated with respective location information (P1, P2/P2, P3/P3, P1) of combined two wafer edges among location information (P1, P2, P3) of at least three wafer edges, and the center point of the final wafer W may be determined by averaging the calculated center points of the wafer. A plurality of wafer center points may be calculated using the obtained wafer edge location information, and a final wafer center point, for example, a final wafer center coordinate may be calculated by averaging only wafer center points located within a tolerance range for the wafer center.

In detail, as illustrated in FIG. 8, the main controller issues an n-th wafer pick command to the robot arm 200 (S710), and the laser scanner 110 performs a laser scan on the wafer seating portion 210 (S720). To seat the picked wafer, the state of the wafer seating portion 210 should be determined. To this end, the laser scanner 110 performs scanning.

According to the above-described method, a data set for a wafer state may be created (S730). As an example, the data set may include information on the presence or absence of a wafer W or the position of a wafer edge.

The robot arm 200 may acquire three or more wafer edge coordinates from the received data set (S740). When the obtained wafer edge coordinate deviation is within the deviation threshold range (YES in S750), center coordinates may be calculated using two of the acquired wafer edge coordinates (S760). When the obtained wafer edge coordinate deviation is out of the critical range (NO in S750), a data set outside the critical range may be deleted and a new data set may be extracted (S770).

When the center coordinate calculated using the wafer edge coordinate in which the obtained wafer edge coordinate deviation is within the deviation threshold range is located within the tolerance range (YES in S780), it is determined that the center of the wafer (W) is in the correct position and the alignment is completed, and the wafer (W) is seated in that position, and when the calculated center coordinates are outside the tolerance range (NO in S780), a wafer movement command may be given to the robot arm 200 as much as the center coordinate error range of the wafer (W) (S790).

In S790, the interface unit 120 commands the robot arm 200 to pick up the unaligned wafer W, and X and Y-axis coordinates on which the wafer W is to be placed may be corrected by calculating a positional error between a preset tolerance range and the currently calculated coordinates of the center of the wafer. The robot arm 200 may re-seat the wafer (W) with the corrected axial coordinates. At this time, the flag bit is transmitted to the robot arm 200 so that the robot arm 200 may perform an alignment operation, and the robot arm 200 may be driven to the corrected position using the center coordinates calculated by the detection unit 121. The same content as the above will be omitted for brevity of description.

On the other hand, the method of aligning a wafer according to an embodiment may further include at least one of detecting the presence or absence of a wafer (W) of the wafer seating portion 210 by comparing the acquired location information of the wafer edge with a peak distance within a preset vertical area; and comparing the acquired location information of the wafer edge with the inner limit 1115 and the outer limit 1116 of the wafer seating portion 210 to detect whether the wafer is detached.

When a peak distance is detected within a preset area using one of the obtained location information of the wafer edge, it is determined that the wafer W is in the wafer seating portion 210, and when the peak distance is not detected, it may be determined that there is none.

According to an embodiment, an image may be obtained by irradiating a laser toward the wafer W at a certain angle from the rear side or lower side of the wafer, the distance to a position of the wafer (W) or the wafer seating portion 210 corresponding to the laser irradiation direction in the acquired image may be measured, and the presence or absence of the wafer W may be detected according to the peak distance among the measured distances for respective preset vertical areas.

The preset vertical area may be preset by dividing a wafer seating area based on the field of view of the laser scanner 110 and semiconductor device information.

As an example, the detection unit 121 may detect a dead zone for each preset channel in the image, and may detect the presence or absence of an edge of the plurality of wafers W according to the detected dead zone.

In addition, the detection unit 121 according to an embodiment may determine whether the wafer edge is positioned and aligned between the inner limit 1115 and the outer limit 1116 preset according to the instrument seating limit or whether the location is out of the range of the inner limit 1115 and the outer limit 1116, using two pieces of location information among the acquired wafer edge location information. Apart from determining the center alignment, it can be simply determined whether the wafer (W) is within the range in which it is to be seated.

Accordingly, the detection unit 121 according to an embodiment may not only detect center alignment of the wafer but also determine whether the wafer is present or whether the wafer is separated.

In addition, in describing the present disclosure, '- part' or 'unit' may be implemented in various manners, for example, by a processor, program instructions executed by the processor, software modules, microcodes, computer program products, logic circuits, application-specific integrated circuits, firmware, or the like.

The contents of the method disclosed in the embodiments of the present application may be directly implemented by a hardware processor, or may be implemented and completed by a combination of hardware and software modules among processors. The software modules may be stored in storage media of the related art such as random access memory, flash memory, read only memory, programmable read only memory or electrically erasable programmable memory, registers, or the like. The storage medium is located in a memory, and the processor reads the information stored in the memory and combines with the hardware to complete the content of the above method. To avoid duplication, detailed descriptions are omitted herein.

In the process of implementation, each content of the above-described method may be completed by a logic integrated circuit of hardware in a processor or instructions in the form of software. The contents of the method disclosed in the embodiments of the present application may be directly implemented by a hardware processor, or may be implemented and completed by a combination of hardware and software modules among processors. The software modules may be stored in storage media of the related art such as random access memory, flash memory, read only memory, programmable read only memory or electrically erasable programmable memory, registers, or the like. The storage medium is located in the memory, and the processor reads the information stored in the memory and combines the same with the hardware to complete the contents of the above method.

For example, those skilled in the art know that it may be implemented by electronic hardware or a combination of computer software and electronic hardware by combining each exemplary unit and algorithm operation described in the embodiments disclosed in this specification. Whether these functions are performed by hardware or software is determined by the specific application of the technical solution and the design constraints. Those Skilled in the art may implement the described functionality using different methods for respective particular applications, but such implementations should not be considered outside the scope of the present application.

In the several embodiments provided in this application, it should be understood that the disclosed devices and methods may be implemented in other manners. For example, the device embodiments described above are merely illustrative, and for example, the division of the unit is only a logical function division, and in actual implementation, other division methods may be provided. For example, a plurality of units or the assembly may be coupled or integrated into one other system, or some features may be ignored or not performed. On the other hand, the couplings or direct couplings or mutual communication connections illustrated or discussed may be indirect couplings or communication connections through some interface, device or unit, and may be electrical, mechanical or other types.

A unit described above as a separate component may be physically separate, and a component indicated as a unit may or may not be a physical unit, for example, may be located in one place or may be distributed over a plurality of network units. According to actual needs, some or all thereof may be selected to realize the purpose of the solution in this embodiment.

For example, each functional unit in each embodiment of the present application may be integrated into one processing unit, each unit may be present alone, or two or more units may be integrated into one unit.

If the function is implemented in the form of a software functional unit and sold or used as an independent product, the function may be stored in a single computer readable storage medium. Based on this understanding, the technical solution of this application essentially or contributed to the related art, or a portion of the technical solution may be implemented in the form of a software product, and the computer software product is stored in a single storage medium. Thus, one computer device (which may be a personal computer, server, network device, or the like), including some instructions, may perform all or a portion of the operations of the method described in each embodiment of the present application. Examples of the above-described storage medium include various media capable of storing program codes, such as a USB memory, a mobile hard disk, a read-only memory (ROM), a random access memory (RAM), a magnetic disk, or a CD-ROM.

As set forth above, according to an embodiment, wafer alignment may be determined at once using one laser scanner for a plurality of stacked wafers, and in detail, whether the center of the wafer is in place may be determined by calculating the exact center point of the wafer, and device simplification is possible, and costs and time may be reduced.

While embodiments have been illustrated and described above, it will be apparent to those skilled in the art that modifications and variations could be made without departing from the scope of the present disclosure as defined by the appended claims.

What is claimed is:

1. A method of aligning a wafer using a laser scanner, the method comprising:

a laser irradiation operation of irradiating a laser toward the wafer using a laser scanner disposed on a rear side or a lower side of the wafer and obtaining an image;

a dataset acquisition operation of obtaining location information of at least three points on a wafer edge by using a distance corresponding to a laser irradiation direction to the wafer edge in the image;

a calculation operation of calculating a center point of the wafer by using the obtained location information of the at least three points on the wafer edge; and a detection operation of detecting whether a calculated center point is within a preset tolerance range, wherein the dataset acquisition operation includes, extracting first location information, second location information, and third location information of the wafer edge in the image; and detecting whether deviations of the first location information, the second location information and the third location information extracted in the extracting are within a preset deviation threshold range, and wherein in the calculation operation, when it is detected that the deviations of the first location information, the second location information, and the third location information are within the preset deviation threshold range, the center point of the wafer is calculated using a radius of the wafer and at least two pieces of location information of the first location information, the second location information and the third location information, and when it is detected that the deviations of the first location information, the second location information, and the third location information are out of the preset deviation threshold range, the first location information, the second location information and the third location information are deleted, and location information of a new wafer edge is acquired.

2. The method of claim 1, wherein the preset tolerance range or the preset deviation threshold range is preset in consideration of wafer information, including a notch position of the wafer or a wafer size, and mechanical characteristics of a wafer seating portion.

3. The method of claim 1, further comprising an alignment operation of issuing a wafer movement command to a robot arm for transferring the wafer by an error range between the calculated center point of the wafer and the preset tolerance range, when the calculated center point is located outside the preset tolerance range.

4. The method of claim 3, wherein in the alignment operation, a wafer state according to whether the wafer is aligned is generated as a flag bit, and a data set generated as the flag bit is transmitted to the robot arm or a main controller.

5. The method of claim 1, further comprising at least one of:

detecting an existence of the wafer on a wafer seating portion by comparing the obtained location information of the wafer edge with a peak distance in a preset vertical area; and comparing the obtained location information of the wafer edge with an inner limit and an outer limit of the wafer seating portion to detect whether the wafer is detached.

6. The method of claim 1, wherein the calculation operation includes determining a final wafer center point based on a position of the laser scanner when the center point of the wafer calculated using location information of two points of the wafer edge is plural.

7. The method of claim 1, wherein:

the at least three points on the wafer edge comprise a first point, a second point, and a third point, and the calculation operation includes:

calculating a first center point of the wafer using a radius of the wafer, location information of the first point of the wafer edge, and location information of the second point of the wafer edge, a second center point of the wafer using the radius of the wafer, the location information of the second point of the wafer edge, and location information of the third point of the wafer edge, a third center point of the wafer using the radius of the wafer, the location information of the third point of the wafer edge, and the location information of the first point of the wafer edge, and determining a center point of a final wafer by averaging the calculated first. second, and third center points of the wafer.

8. An apparatus for aligning a wafer, using a laser scanner, the apparatus comprising:

a laser scanner disposed on a rear side or a lower side of the wafer and irradiating a laser toward the wafer; and a detection unit obtaining location information of at least three points on a wafer edge by using a distance corresponding to a laser irradiation direction to the wafer edge in an image obtained by the laser scanner, wherein the detection unit calculates a center point of the wafer using the obtained location information of the at least three points of the wafer edge, and detects whether the calculated center point is within a preset tolerance range to determine a wafer alignment state, wherein the detection unit is configured to extract first location information, second location information, and third location information with respect to the wafer edge in the image and to detect whether a deviation of the extracted first location information, second location information and third location information is within a preset deviation threshold range, and wherein the detection unit is configured to calculate the center point of the wafer using a radius of the wafer and at least two pieces of location information of the first location information, the second location information, and the third location information, when it is detected that the deviation of the first location information, the second location information, and the third location information is within the preset deviation threshold range, and is configured to delete the first location information. the second location information, and the third location information and to acquire location information of a new wafer edge, when it is detected that the deviation of the first location information, the second location information, and the third location information is out of the preset deviation threshold range.

9. The apparatus of claim 8, wherein the preset tolerance range or the preset deviation threshold range is preset in consideration of wafer information, including a notch position or a wafer size of the wafer, and mechanical characteristics of a wafer seating portion.

10. The apparatus of claim 8, wherein the detection unit is configured to give a wafer movement command to a robot arm for transferring the wafer by an error range between a calculated center point of the wafer and the preset tolerance range, when the calculated center point is located outside the preset tolerance range.

11. The apparatus of claim 10, wherein the detection unit is configured to generate a wafer state according to whether the wafer is aligned as a flag bit, and transmit a data set generated as the flag bit to the robot arm or a main controller.

12. The apparatus of claim 8, wherein the detection unit is configured to compare the obtained location information of the wafer edge with a peak distance in a preset vertical area to detect a presence or absence of a wafer on the wafer seating portion, or is configured to compare the obtained location information of the wafer edge with an inner limit and an outer limit of the wafer seating portion to detect whether the wafer is detached.

13. The apparatus of claim 8, wherein the detection unit is configured to determine a final wafer center point based on a location of the laser scanner when the center point of the wafer calculated using location information of two points of the wafer edge is plural.

14. The apparatus of claim 8, wherein;

the at least three points on the wafer edge comprise a first point, a second point, and a third point, and the detection unit is configured to calculate a first center point of the wafer using a radius of the wafer, location information of the first point of the wafer edge, and location information of the second point of the wafer edge, a second center point of the wafer using the radius of the wafer, the location information of the second point of the wafer edge, and location information of the third point of the wafer edge, a third center point of the wafer using the radius of the wafer, the location information of the third point of the wafer edge, and the location information of the first point of the wafer edge, and to determine a center point of a final wafer by averaging the calculated first. second, and third wafer center points of the wafer.

15. The apparatus of claim 8, wherein the laser scanner is one laser scanner, and the detection unit is an interface board connected to the laser scanner by forming one channel and capable of transmitting data to an external device.

16. A semiconductor transfer device comprising:

a wafer seating portion configured to support a wafer;

a robot arm seating the wafer on the wafer seating portion;

one laser scanner disposed on the robot arm located on a rear side or a lower side of the wafer and irradiating a laser to a wafer edge seated on the wafer seating portion; and an interface unit including a detection unit detecting the wafer edge in an image acquired by the laser scanner and a communication unit communicating with the robot arm and the laser scanner, wherein the detection unit extracts location information of two points of the wafer edge in which a location information deviation of the two points of the wafer edge is within a preset deviation threshold range from among obtained location information of at least three points of the wafer edge, calculates a center point of the wafer using extracted location information of the two points of the wafer edge and mechanical information of the wafer or the wafer seating portion, and detects whether the calculated center point is within a preset tolerance range to determine a wafer alignment state, wherein the detection unit is configured to extract first location information, second location information, and third location information with respect to the wafer edge in the image and to detect whether a deviation of the extracted first location information, second location information and third location information is within a preset deviation threshold range, wherein the detection unit is configured to calculate the center point of the wafer using a radius of the wafer and at least two pieces of location information of the first location information, the second location information, and the third location information, when it is detected that the deviation of the first location information, the second location information, and the third location information is within the preset deviation threshold range, and is configured to delete the first location information, the second location information. and the third location information and to acquire location information of a new wafer edge, when it is detected that the deviation of the first location information, the second location information. and the third location information is out of the preset deviation threshold range.

* * * * *